United States Patent [19]

Oh et al.

[11] Patent Number: 5,406,203
[45] Date of Patent: Apr. 11, 1995

[54] METHODS OF MULTISLICE ACQUISITION FOR MAGNETIC RESONANCE IMAGING

[75] Inventors: Chang-Hyun Oh, Franklin Lakes; Sadek K. Hilal, Englewood Cliffs, both of N.J.

[73] Assignee: The Trustees of Columbia University in the City of New York, New York, N.Y.

[21] Appl. No.: 927,841

[22] Filed: Aug. 10, 1992

[51] Int. Cl.$^6$ .............................................. G01V 3/00
[52] U.S. Cl. .................................. 324/309; 324/307
[58] Field of Search ............... 324/309, 307, 310, 312, 324/313, 314, 318

[56] References Cited

U.S. PATENT DOCUMENTS

| | | | |
|---|---|---|---|
| 4,717,879 | 1/1988 | Riederer et al. | 324/309 |
| 4,733,187 | 3/1988 | Shimazaki et al. | 324/312 |
| 4,847,560 | 7/1989 | Sattin | 324/309 |
| 4,908,578 | 3/1990 | Van Liere | 324/309 |
| 5,237,273 | 8/1993 | Plewes et al. | 324/309 |

OTHER PUBLICATIONS

Bydder, G. M. and Young, I. R., MR Imaging: Clinical Use of the Inversion Recovery Sequence, J. Computer Assisted Tomography, 9 (4), pp. 659–675 (Jul./Aug. 1985).
Chisin, R. et al., Preliminary Clinical Results with Low Flip Angle Spin-Echo MR Imaging of the Head and Neck, Am. J. Neuroradiol., 10 (4), pp. 719–724 (Jul./Aug. 1989).
Crooks, L. E. et al., Clinical Efficiency of Nuclear Magnetic Resonance Imaging, Radiology, 146, pp. 123–128 (Jan. 1983).
Lehmann, B. et al., Signal Suppression of Normal Liver Tissue by Phase Corrected Inversion Recovery: A Screening Technique, J. Computer Assisted Tomography, 13 (4), pp. 650–655 (Jul./Aug. 1989).
Mao, J. et al., Optimal Selective Inversion RF Pulse, Book of Abstracts, Society of Magnetic Resonance in Medicine, Fifth Annual Meeting, 4, (Aug. 22, 1986).
Moran, P. R. et al., Tissue Contrast Enhancement: Image Reconstruction Algorithm and Selection of TI in Inversion Recovery MRI, Magn. Reson. Imaging, 4, pp. 229–235 (1986).
Ordidge, R. J. et a., High-Speed Multislice $T_1$ Mapping Using Inversion-Recovery Echo-Planar Imaging, Magn. Reson. Med., 16, pp. 238–245 (1990).
Park, H. W. et al., Real-Value Representation in Inversion-Recovery NMR Imaging by Use of a Phase-Correction Method, Magn. Reson. Med., 3, ppp. 15–23 (1986).
Park, H. W. et al., Time-Multiplexed Multislice Inversion-Recovery Techniques for NMR Imaging, Magn. Reson. Med., 2, pp. 534–539 (1985).
Shetty, A. N., Suppression of Radiofrequency Interference in Cardiac Gated MRI: A Simple Design, Magn. Reson. Med., 8, pp. 84–88 (1988).
Silver, M. S. et al., Highly Selective $\pi/2$ and $\pi$ Pulse Generation, J. of Magn. Reson., 59, pp. 347–351 (1984).
Souza, S. P. et al., SIMA: Simultaneous Multislice Acquisition of MR Images by Hadamard-Encoded Excitation, J. Computer Assisted Tomography, 12 (6), pp. 1026–1030 (Nov./Dec. 1988).
Young, I. R. et al., Problems with Achieving Saturation Using Methods Based on Bursts of rf Pulses with Spoilers in Magnetic Resonance Imaging, Magn. Reson. Med., 11, pp. 127–131 (1989).
Young, I. R. et al., The Design of a Multiple Inversion Recovery Sequence for T1 Measurement, Magn. Reson. Med., 5, pp. 99–108 (1987).
Young, I. R. et al., Apparent Changes of Appearance of Inversion-Recovery Images, Mag. Reson. Med., 2, 81–85 (1985).

Primary Examiner—Louis Arana
Attorney, Agent, or Firm—Brumbaugh, Graves, Donohue & Raymond

[57] ABSTRACT

An optimized multislice data acquisition method and apparatus for magnetic resonance imaging is disclosed. In this new method, instead of forming a set of multislice image sequences in series for a given phase encoding step, initiation sequences corresponding to different slices are interwoven with acquisition sequences in an optimal way depending on the desired initiation sequence time. A number of acquisition and initiation sequences are inserted with different slice combinations, between the initiation sequence and acquisition sequence, i.e., long initiation sequence time is effectively utilized for the other slice data acquisition. With this optimized method, imaging time can be reduced by as much as a factor of four compared to existing methods.

16 Claims, 5 Drawing Sheets

A B C D

LEGEND:

A- 1st INITIATION SEQUENCE FOR SLICE 2 (180° INVERSION RF PULSE)

B- 1st ACQUISITION SEQUENCE FOR SLICE 1 (40°-180° DATA ACQUISTION)

C- 2nd INITIATION SEQUENCE FOR SLICE 2 (PARTIAL INVERSION RF PULSE APPLIED WITH A VOLUME-SELECTION GRADIENT TO SUPPRESS FLOW ARTIFACT)

D- 2nd ACQUISTION SEQUENCE FOR SLICE 1 (180° DATA ACQUISITION)

METHODS OF MULTISLICE ACQUISITION FOR MAGNETIC RESONANCE IMAGING

SPECIFICATION

This invention was made with government support under grant CA-28881 awarded by the National Cancer Institute. The government has certain rights in the invention.

This invention relates to magnetic resonance imaging, more particularly to an optimized multislice data acquisition technique for magnetic resonance imaging.

BACKGROUND OF THE INVENTION

Nuclear magnetic resonance (NMR) imaging has been known and used as a noninvasive diagnostic tool by physicians for some time. One technique for obtaining diagnostic image includes building an image out of a series of planar images to obtain the entire image and then reconstructing the desired slice for visualization purposes.

Conventional multislice imaging methods involves applying an initiation sequence, followed by an acquisition sequence. The initiation sequence may include one or more 1° to 180° saturation pulses, 180° inversion pulses, 90°–180° partial inversion pulses, or combinations thereof. Typically, 90° saturation pulses are applied in the initiation sequence in time of flight flow imaging or for flow artifact suppression, while 180° inversion pulses are applied for more routine image scanning.

After application of an inversion pulse the magnetization of the sample is reversed but recovers exponentially with a time constant $T_1$, the longitudinal relaxation time. During the acquisition sequence, at least one spin echo sequence or gradient echo sequence is applied, and the "echo" emitted from the sample is detected and analyzed. The spin echo or gradient echo may include a 1° to 180° saturation pulse to reduce artifacts arising from blood flow motion. The amplitude of the induced echo depends on $T_2$, the spin-spin relaxation time. In some cases to obtain better tissue contrast, multiple echo sequences may be applied. The signal produced and measured with either a spin echo or gradient echo is spatially encoded to produce a sample image. Typically, spatial encoding comprises application of three magnetic field gradients, a slice selection gradient, phase encoding gradient, and a readout gradient, and Fourier analysis of the accumulated data. Whole-body NMR imagers typically require repeated RF irradiations to form an image.

Due to its ability to give good $T_1$ contrast differentiation and selective suppression capability, for example fat suppression, inversion recovery imaging is useful in many clinical applications. However, because of the long recovery times required upon application of an inversion pulse, its use generally results in obtaining inversion recovery images for only a limited number of sample slices over a given time period.

During the time a patient undergoes NMR imaging, they are inaccessible to the physician. A minimum residence time in the NMR image scanner is desirable for critically ill or claustrophobic patients where immediate intervention may become necessary. Moreover, a minimum patient residence time in the NMR image scanner is desirable as it allows for increased throughput in an expensive piece of equipment. By decreasing patient residence time, more patients can undergo NMR imaging in a given time period enabling a medical institution or medical office to more quickly recoup the high capital cost of purchasing NMR image scanning equipment.

In this regard, two multislice acquisition schemes have been proposed for more efficient NMR imaging.

The first method is similar to the conventional multislice acquisition scheme for saturation recovery imaging described in Crooks, L. E.; Ortendahl, D. A.; Kaufman, L., et al.; "Clinical efficiency of nuclear magnetic resonance imaging" Radiology, 146:123-128; 1983. In this method, illustrated in FIG. 1, the combination of an inversion RF pulse initiation sequence and acquisition sequence for each slice is repeated for multislice acquisition during each repetition series. An acquisition sequence composed of selective 90° and 180° RF pulses is selected as an example. FIG. 1 shows the pulse sequence, where selective RF pulses and echo signals are shown as white Gaussian-function-shaped pulses and black triangles, respectively. Small and large white pulses represent respectively 90° and 180° RF pulses. $T_r$ is the repetition time between encodings of Fourier imaging sequence (between views in case of projection-reconstruction-type imaging, or between measurements for multiple measurement case), $T_s$ is the interval between the acquisitions of different slices. $T_a$ is the minimum length of the acquisition pulse sequence (possibly multiecho sequence) for one slice and one encoding (including some overhead for data transfer and system control and not including the inversion RF pulse and recovery time), $T_p$ is the width of the slice-selective inversion RF pulse (including the time for any artifact suppression spoiling gradient if necessary), and $T_i$ is the recovery time from spin inversion which is defined as the time interval between the inversion pulse and the acquisition sequence for a given slice. As can be seen from FIG. 1, the minimum $T_s$ for each slice is $T_i + T_a$. The maximum number of slices that can be acquired using this sequence, $N_1$, can be expressed as $$N_1 = \text{Int } [T_r/(1T_i + T_1)], \qquad (1)$$

where Int(x) is defined as the maximum integer not greater than x. Although this method is efficient when $T_i$ is short, it is not useful otherwise.

A second conventionally used method is a pulse sequence where the inversion-recovery time is used for the inversion pulses for other slices and is illustrated in FIG. 2. The maximum number of slices which can be acquired by using this method can be calculated as follows. Since the acquisition sequence corresponding to each inversion RF pulse takes at least $T_a$, the maximum number of inversion pulses that can be placed during one inversion-recovery time ($T_i$) with this interval $T_a$ is $(T_i-T_p)/(T_a)$. The acquisition sequence for these additional slices are applied after the acquisition sequence of the first slice. The total number of slices for one series of RF and acquisition sequences composed as this, N, can be expressed as $$N = \text{Int } [(T_i - T_p)/T_a] + 1. \qquad (2)$$

The acquisition time of N slices are $(T_i + N * T_a)$. Although only one series for N slices is shown in FIG. 2, this can be repeated more than once, i.e. for additional slices, if $T_r$ is long enough. The number of the series in one $T_r$, M, can be expressed as $$M = \text{Int } [T_r/(T_{iI} + N*T_a)]. \qquad (3)$$

Thus the total number of slices, $N_2$, can be expressed as $$N_2 = N*M. \quad (4)$$

This method is useful when inversion-recovery time is long such that many inversion pulses can be applied during one recovery time. Although this method utilizes the inversion-recovery time for the acquisition of other slices, there still remains some unused time between RF pulses for each series. Thus, none of the existing multislice data acquisition methods for inversion-recovery magnetic resonance imaging provide an optimized sequence for efficient time utilization.

SUMMARY OF THE INVENTION

This invention relates to a multislice magnetic resonance data acquisition method comprising applying a stable longitudinal magnetic field, applying a series of imaging sequences to a subject, each imaging sequence comprising at least one initiation sequence and at least one acquisition sequence, and interleaving at least one acquisition sequence corresponding to one or more slices of the subject between successive initiation sequences for different slices, thereby minimizing patient residence time in the NMR image scanner and maximizing efficient utilization of equipment and physician resources.

This invention also relates to a multislice magnetic resonance image scanner comprising a means for applying a stable longitudinal magnetic field to a subject, a means for applying a series of imaging sequences to the subject, each imaging sequence comprising at least one initiation sequence and at least one acquisition sequence, and a means for interleaving at least one acquisition sequence for one slice of the subject with successive initiation sequences for different slices.

DETAILED DESCRIPTION OF THE INVENTION

In an exemplary method according to the invention, the imaging sequence is composed of a series of an inversion RF pulse initiation sequence and an acquisition sequence, which is repeated as many times as the number of slices for each repetition or encoding step. Unlike the method shown in FIG. 1, the inversion pulse does not correspond to the same slice as the following acquisition sequence, but corresponds to the slice acquired later after one or more inversion pulses corresponding to different slices. In those cases where the acquisition sequence comprises multiple spin or gradient echoes, each spin or gradient echo follows an inversion pulse for a different slice. The inversion pulses corresponding to the first few slices are applied during the sequence of the previous repetition or encoding step. For the first encoding step or repetition, the inversion pulses corresponding to respective slices are applied during the equilibrium sequence which is applied before the main data acquisition sequence.

Although the imaging sequence in accordance with the present invention is similar in appearance to that in the simplest multislice inversion-recovery pulse sequence (shown in FIG. 1) with a very short inversion-recovery time, unlike prior art pulse sequences, the inversion pulse of the present invention does not correspond to the same slice as its adjacent acquisition sequence. In the claimed invention, the inversion pulse in the i-th sequence is for the slice acquired in the Mod-$(i+L)$th acquisition sequence, where L is a constant showing the number of shift of the acquisition sequence and Mod(x) is defined as $$\begin{aligned}\text{Mod}(x) &= x - \text{(total number of slices)}, \\ &\quad \text{if } x \text{ is greater than the total number} \\ &\quad \text{of slices} \\ &= x, \text{ otherwise}.\end{aligned} \quad (5)$$

Figure 3A:
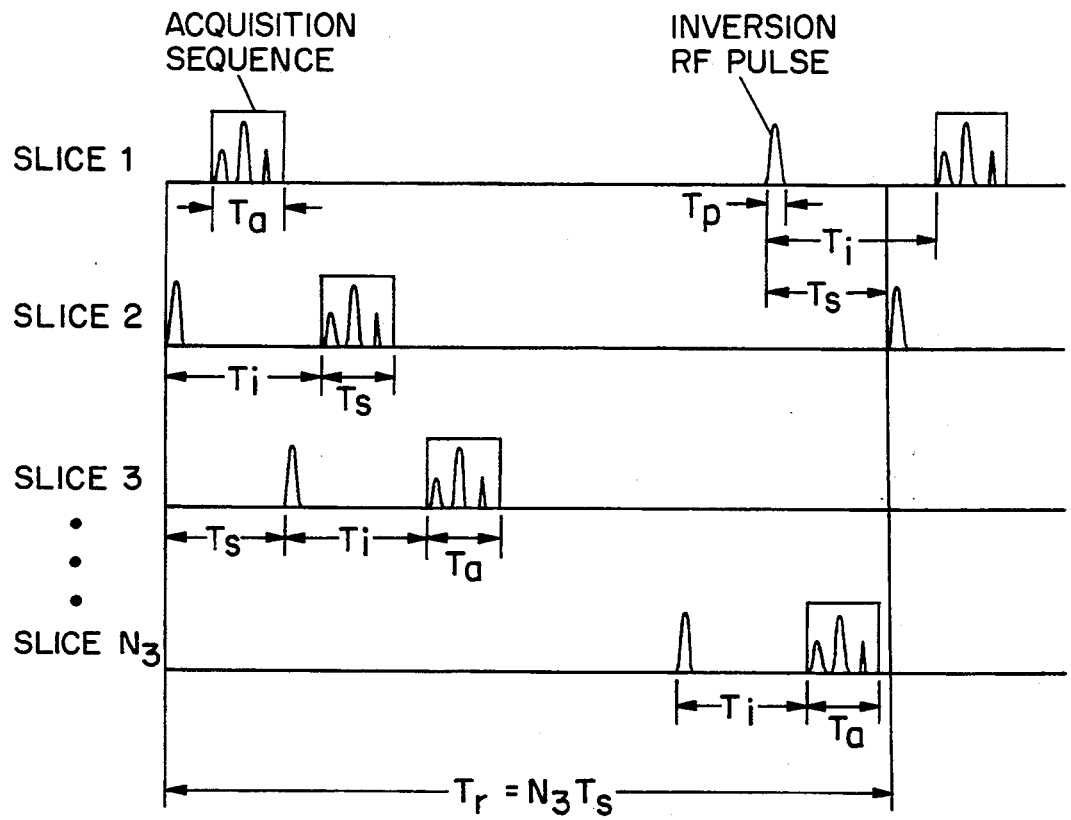
FIGS. 3(a) to 3(c) are a multislice inversion-recovery imaging sequence according to the invention (a) for $L=1$, the sequence for each slice is shown separately; (b) after combining all the sequences in (a); (c) for a general L, slice number is shown for each inversion pulse and acquisition sequence in (b) and (c).
Figure 3B:
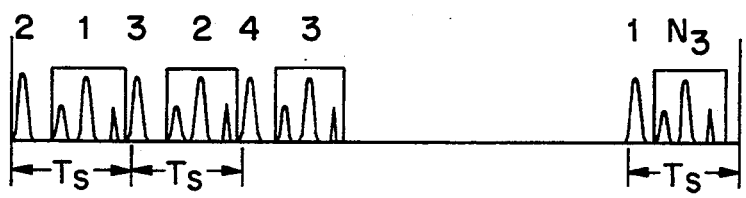
Figure 3C:
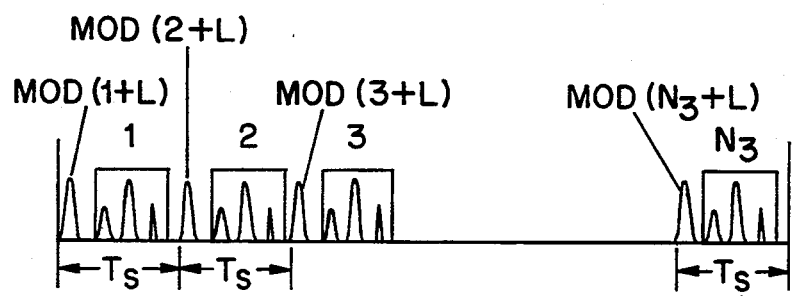

FIG. 3(a) shows the RF pulse sequence for a multislice acquisition method in accordance with the invention where $L=1$. The pulse sequence for each slice is shown separately. FIG. 3(b) shows the sequence after combining those for all the slices. FIG. 3(c) shows the pulse sequence with a general integer L.

In this method, $T_r$ is an integer multiple of $T_s$. For a given $T_r$, $T_a$, $T_i$, and $T_p$, the maximum number of slices that can be obtained is calculated as follows.

The maximum number of shift $L_{max}$, can be expressed as $$L_{max} = \text{Int}\,[(T_i - T_p)/(T_a + T_p)]. \quad (6)$$

Any integer L can be chosen if it is not greater than $L_{max}$. Shifting by $L_{max}$ gives the most slices. For a given L, the range of $T_s$ is calculated as $$[(T_i + T_a)/(L+1)] = T_{s,min} \leq T_s \leq T_{s,max} = [(T_i - T_p)/L]. \quad (7)$$

The corresponding range of total number of slices, $N_3$, is given by $$T_r/T_{s,max} = N_{3,min} \leq N_3 \leq N_{3,max} = T_r/T_{s,min} \quad (8)$$

Any integer in this range can be chosen for pulse sequence design, usually the maximum number is selected so as to acquire the most slices. Although an integer might not exist in the range of Eq. (8), a lower number of shift (L) can be chosen to get an integer $N_3$, or, alternatively, $T_r$ can be altered slightly since the effect of slightly different $T_r$ on the image contrast is usually negligible. Once $N_3$ is chosen, $T_s$ can be calculated as $$T_s = T_r/N_3 \quad (9)$$

Figure 1:
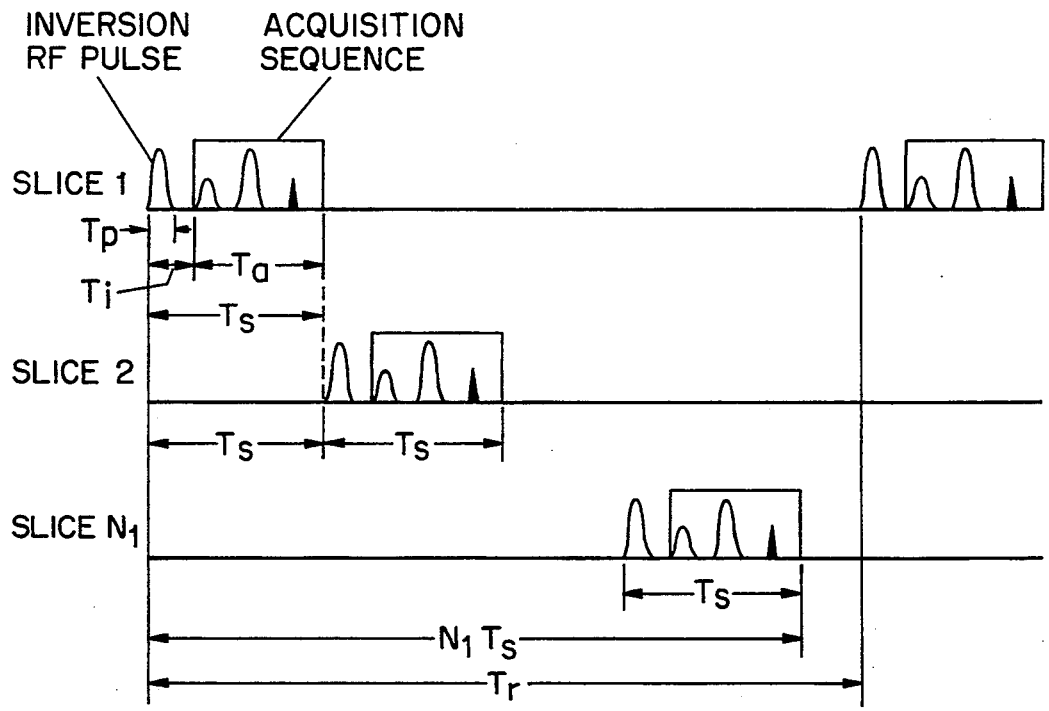
FIG. 1 illustrates a prior art multislice inversion-recovery imaging sequence.
Figure 2:
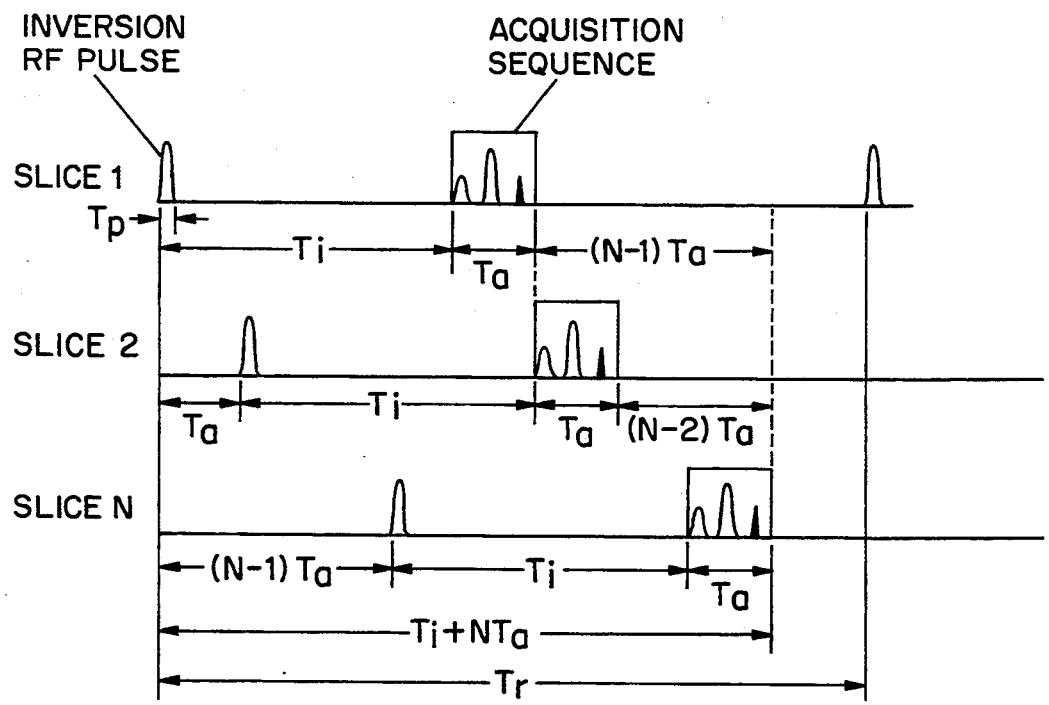
FIG. 2 illustrates another prior art multislice inversion-recovery imaging sequence.

The maximum numbers of slices obtainable with the claimed invention as compared to the prior methods shown in FIG. 1 and FIG. 2 is as follows. Neglecting $T_p$ and $T_a$ compared with $T_i$, the approximate maximum numbers of slices for the three methods can be expressed as $$N_{1'} = T_r/(T_i + T_a),$$

$$N_{2'} = T_r/(2T_a),$$

and $$N_3^1 = T_r/T_{a'} \quad (10)$$

where $N_1'$, $N_2'$ and $N_3'$ represent approximate maximum obtainable slice numbers for the prior art methods and the claimed invention, respectively. As shown in equation (10), $N_1'$ decreases as $T_i$ increases, thus the method illustrated in FIG. 1 is efficient only when $T_i$ is short. The method illustrated in FIG. 2 can provide more slices than the method illustrated in FIG. 1 when $T_i$ is long since $N_2'$ is not dependent on $T_i$. However, the number of slices obtained using a method according to the present invention is improved by a factor of two as compared to the method illustrated in FIG. 2.

Figure 4:
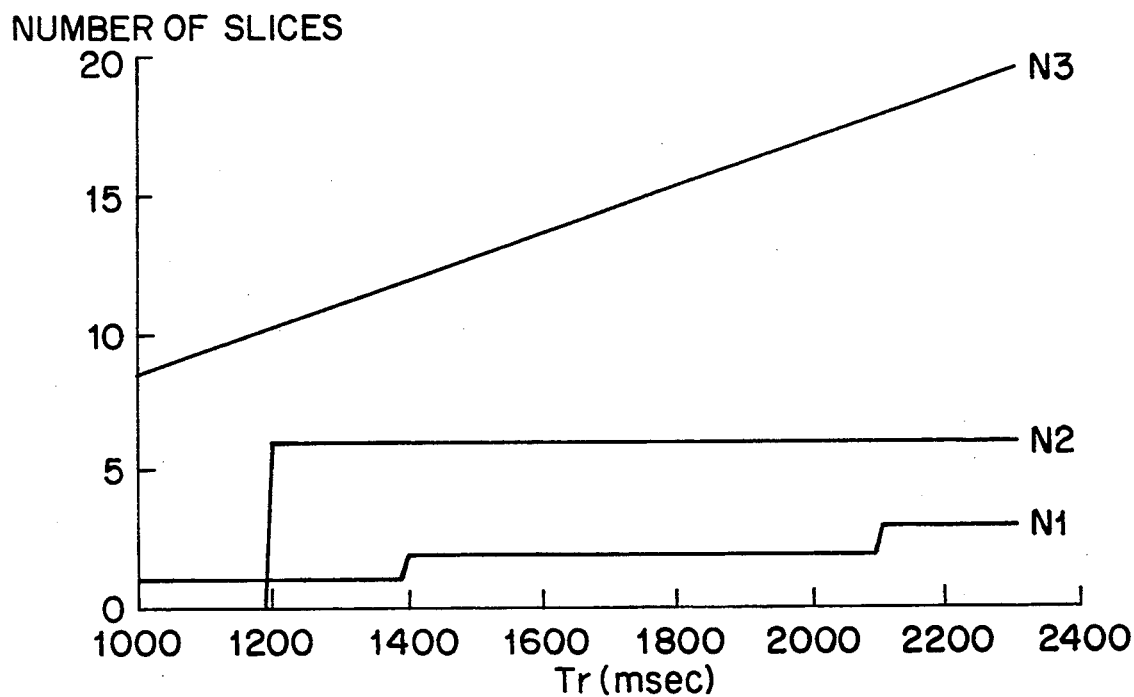
FIG. 4 is a graphical representation of maximum number of obtainable slices versus $T_r$ for two prior art multislice acquisition methods ($N_1$ and $N_2$) and for a multislice image acquisition method according to the present invention ($N_3$) for $T_r=1000$ to 2300 msec; $T_a=100$ msec; $T_p=100$ msec; $T_i=600$ msec.

FIG. 4 illustrates the maximum number of slices ($N_1$, $N_2$, $N_3$) versus the repetition time ($T_r$) for a set of imaging parameters (without approximation; for $T_r = 1000$ to 2300 msec; $T_a = 60$ msec; $T_p = 10$ msec; $T_i = 600$ msec). For a multislice data acquisition method according to the present invention the maximum number of slices was obtained for a maximum L of 5. As would be expected, the method illustrated in FIG. 2 is better than the method illustrated in FIG. 1 for most $T_r$ ranges since $T_i$ is longer than $T_a$. Nevertheless, for relatively long inversion recovery times the claimed method is always more efficient than any of the methods illustrated in FIG. 1 and FIG. 2. It should be noted that, since pulse sequence design is more flexible in the claimed invention than in the method illustrated in FIG. 2, the improvement in the claimed invention over that prior art method is more than three times for some imaging parameters as can be seen from the following example.

Example I

Figure 5:
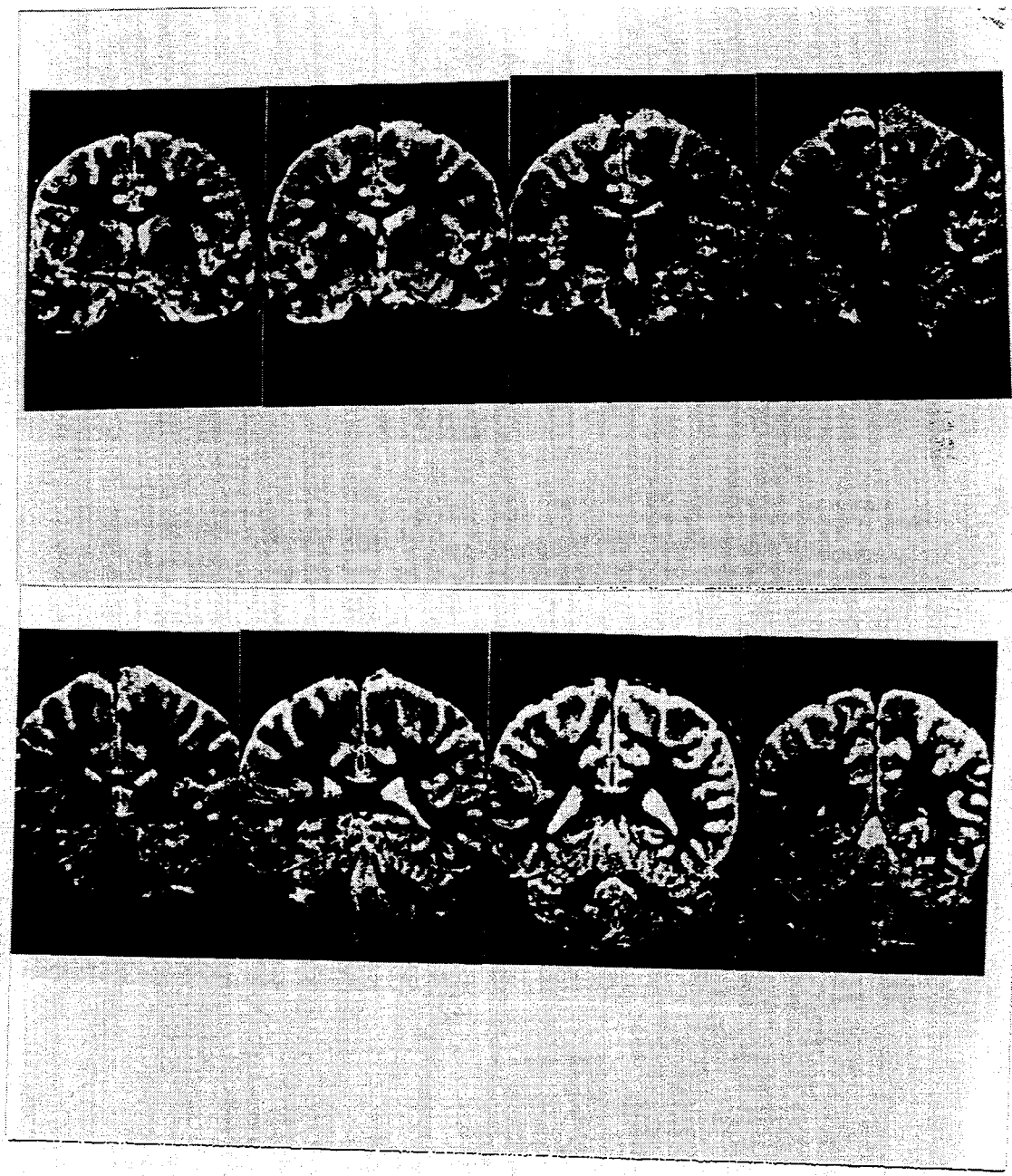
FIG. 5 is a volunteer coronal imaging result using a multislice inversion-recovery sequence according to the present invention. Eight slices are shown as an example among the total of sixteen slices acquired. Echo time was 32 msec for $T_r=2080$ msec; $T_a=100$ msec; $T_p32~8$ msec; $T_i=150$ msec; $T_s=130$ msec.

The claimed method was implemented on the 1.5 Tesla clinical magnetic resonance imaging (MRI) system at Columbia University in New York City and was tested for routine patient scanning. FIG. 5 shows one of the volunteer imaging results. A total of sixteen coronal slices were obtained with an imaging time of 6.6 min for 192 encoding steps. Eight slices are shown among the sixteen slices as an example. A conventional Fourier imaging method was used with an echo time of 32 msec. $T_r$, $T_s$, $T_i$, $T_a$, and $T_p$ were 2080 msec; 130 msec, 150 msec, 100 msec, and 8 msec, respectively. This pulse sequence was designed to maximize the contrast between the gray and white matters while reducing the fat signal and maintaining non-zero image intensity for the white matter. $T_a$ of 100 msec was selected considering the system overhead. Although phase correction is often needed in inversion-recovery imaging for correct T1 contrast, magnitude images were used in this case because most tissues in the brain including both gray and white matters have the same polarity with this $T_i$. It should be noted that the contrast of these images is reversed compared to conventional saturation-recovery T1-weighted or phase-corrected inversion-recovery images. No noticeable artifacts were observed and good contrast between the gray and white matter was obtained. It should be noted that the prior art methods illustrated in FIG. 1 and FIG. 2 can provide only a maximum of 8 or 10 slices, respectively, with the same imaging parameters.

Figure 6A:
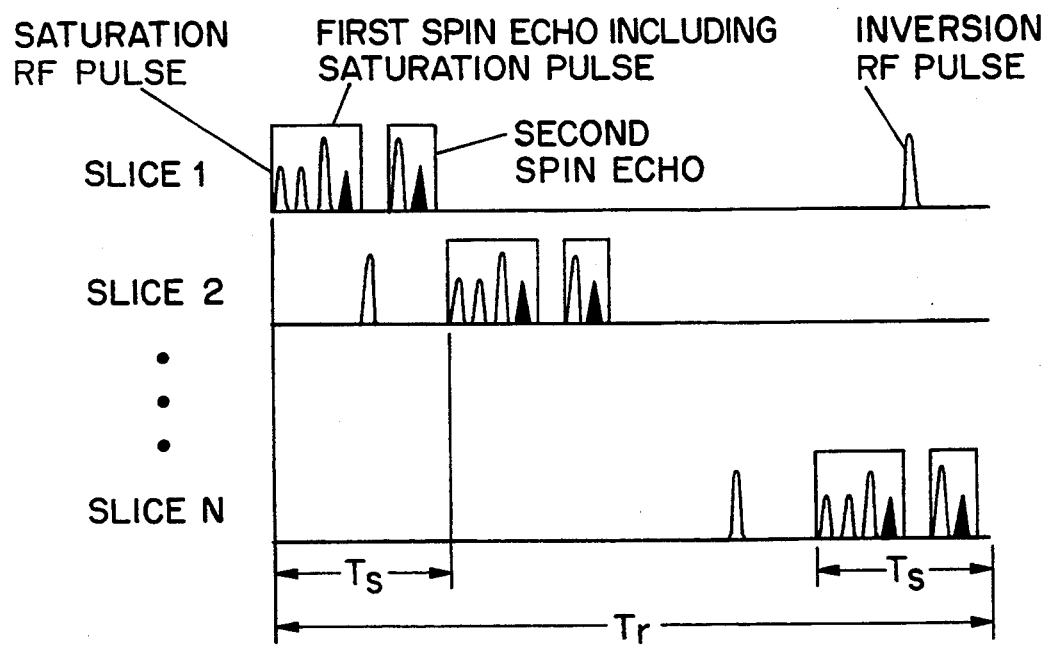
FIGS. 6(a) and 6(b) are a multislice imaging sequence according to the invention comprising a two-echo sequence (a) for $L=1$, the sequence for each slice is shown separately; (b) after combining all the sequences in (a).
Figure 6B:
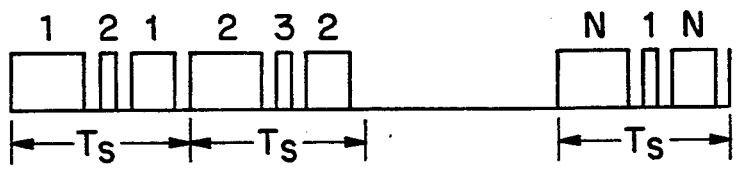

FIG. 6(a) illustrates a multislice acquisition method in accordance with the claimed invention in which a 180° inversion pulse is applied in the initiation sequence and the acquisition sequence comprises two spin echo sequences. As shown in FIG. 6(b), the first spin echo sequence comprising a saturation RF pulse is separated in time from the second spin echo comprising a 180° RF pulse by the initiation sequence (an inversion RF pulse) of a different slice.

Figure 7A:
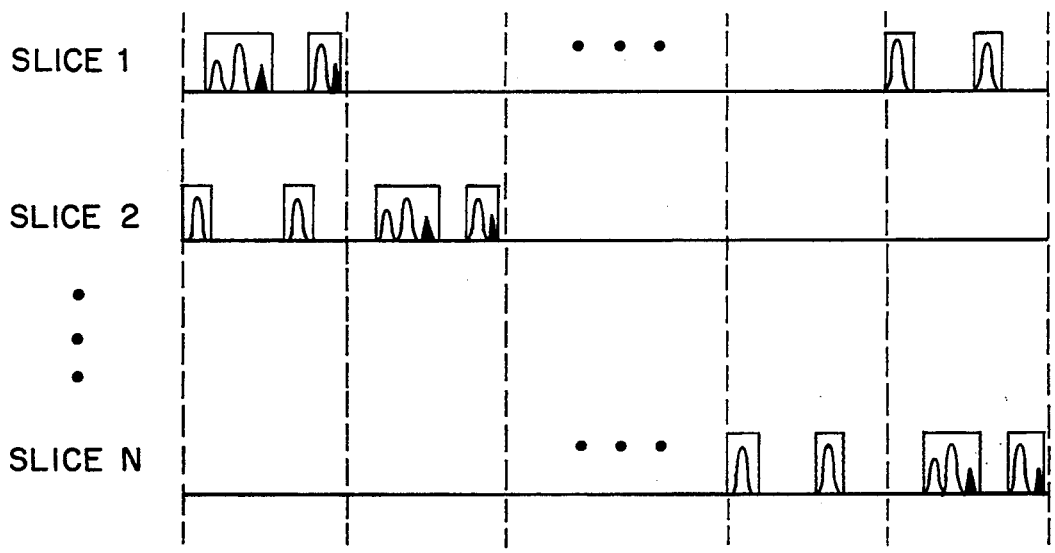
FIG. 7(a), 7(b) are a multislice imaging sequence according to the invention comprising multiple initiation sequences and multiple acquisition sequences.
Figure 7B:
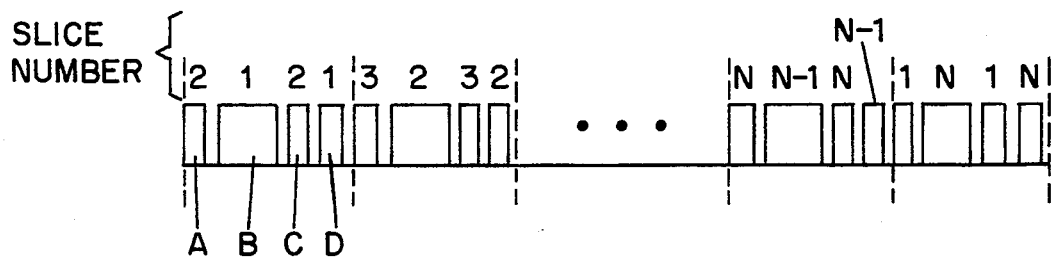

FIG. 7 illustrates a multislice imaging sequence according to the invention wherein the first initiation sequence comprises a 180° inversion pulse and the second initiation sequence comprises a partial inversion pulse. As shown in FIG. 7(b), the first and second initiation sequences for each slice are separated in time from each other as well as the acquisition sequences for the same slice.

The invention described herein is equally applicable to imaging sequences comprising multiple initiation sequences as well as multiple echo sequences and has many advantages when compared to the existing methods. More slices can be acquired with the same repetition time. Also, pulse sequence design is simple. For example, in the method illustrated in FIG. 2, several non-identical pulse series are needed if more than one series are repeated in one $T_r$. Moreover, every slice of the subject experiences almost identical RF and spatial encoding gradient pulse sequences as compared to the method in FIG. 2. This is especially important when some non-negligible transverse magnetization is expected due to partial inversion RF pulses or nonuniformity in 180° inversion RF pulses. Complex gradient and RF pulse sequences, e.g., bipolar gradients to generate gradient-recalled echoes or to suppress flow artifacts or slice-selective RF pulses applied to the adjacent slices may rephase unnecessary spins even with spoiling gradients, resulting in wrong image contrast and artifacts. In accordance with the present invention, it is much easier as compared to the method of FIG. 2 to adjust pulse sequences so that proper RF and gradient pulses are applied for every slice.

In the present invention T1 estimation can be achieved from two or more inversion recovery image sets with different $T_i$'s. However, the use of truncated-sine-function shapes for the spin inversion RF pulses may cause severe estimation error as is the case in any conventional inversion recovery imaging method using selective 180° RF pulses. This is due to the fact that the slice selection profile is somewhat distorted near the slice edge and thus may not provide accurate T1 estimation. In this regard RF pulse shapes can optimized to obtain better slice selectivity. Improved selectivity can be obtained with RF pulse shapes with 8 or 10 zero crossings optimized according to the method[described by Mao, J. T.; Mareci, T. H.; Scott, K. N; Andrew, E. R. "Selective inversion radiofrequency pulses by optimal control. J. Magn. Reson. 70:310-318; 1986. To improve the accuracy still further, slice thickness for the 180° RF pulse can be widened or more zero crossings can be assumed for optimization. Moreover, in the event that the degree of RF nonuniformity in the imaging region is unacceptable, hyperbolic secant function shapes as described in Silver M. S.; Joseph, R. I.; Hoult, D. I. Highly selective $\pi/2$ pulse generation. J. Magn. Reson. 59:347-351; 1984 can be applied to obtain more uniform spin inversion.

By using the multislice acquisition method described herein, time-consuming initiation sequence-recovery, particularly inversion-recovery, imaging is made more time efficient and clinically useful.

We claim:

1. A multislice magnetic resonance data acquisition method comprising:
   applying a stable longitudinal magnetic field;
   applying a series of imaging sequences to a subject, each imaging sequence comprising at least one initiation sequence and at least one acquisition sequence, wherein the initiation sequence comprises an inversion pulse; and
   interleaving at least one acquisition sequence for each slice of said subject between successive initiation sequences for different slices.

2. A multislice magnetic resonance data acquisition method according to claim 1 wherein the imaging sequence comprises at least one initiation sequence, said sequence comprising an inversion pulse and at least one acquisition sequence, said acquisition sequence comprising applying to a subject a spin echo sequence, and a spatial encoding sequence comprising a slice selection gradient, a phase encoding gradient, and a readout gradient.

3. A multislice magnetic resonance data acquisition method according to claim 1 wherein the imaging sequence comprises at least one initiation sequence, said initiation sequence comprising an inversion pulse and at least one acquisition sequence, said acquisition sequence comprising applying to a subject a gradient echo sequence, and a spatial encoding sequence comprising a slice selection gradient, phase encoding gradient, and a readout gradient.

4. A multislice magnetic resonance data acquisition method according to claim 1 wherein the imaging sequence comprises at least one initiation sequence, said initiation sequence comprising an inversion pulse and at least one acquisition sequence, said acquisition sequence comprising applying to a subject a saturation pulse, a spin echo sequence, and a spatial encoding sequence comprising a slice selection gradient, a phase encoding gradient, and a readout gradient.

5. A multislice magnetic resonance data acquisition method according to claim 1 wherein the imaging sequence comprises at least one initiation sequence, said initiation sequence comprising an inversion pulse and at least one acquisition sequence, said acquisition sequence comprising applying to a subject a saturation pulse, a gradient echo sequence, and a spatial encoding sequence comprising a slice selection gradient, phase encoding gradient, and a readout gradient.

6. A multislice magnetic resonance data acquisition method according to claim 2, 3, 4, or 5 wherein the initiation sequence for each slice is followed by the acquisition sequence for the preceding slice.

7. A multislice magnetic resonance data acquisition method according to claim 2, 3, 4, or 5 wherein the initiation sequence for slice Mod(i+L) is followed by the acquisition sequence for slice i where L=maximum integer value not greater than $$\frac{(T_i - T_p)}{(T_a + T_p)}$$

Mod (x) = x − (total number of slices), if x is greater than the total number of slices
= x, otherwise.

$T_i$=time interval between initiation sequence and acquisition sequence for any given slice
$T_p$=width of the initiation sequence for any given slice
$T_a$=time length of the acquisition sequence.

8. A multislice magnetic resonance data acquisition method according to claim 2, 3, 4 or 5 wherein multiple acquisition sequences are applied.

9. A multislice magnetic resonance image scanner comprising:
   means for applying a stable longitudinal magnetic field, to a subject;
   means for applying a series of imaging sequences to a subject, each imaging sequence comprising at least one initiation sequence and at least one acquisition sequence, wherein the initiation sequence comprises an inversion pulse; and
   means for interleaving at least one acquisition sequence for one slice of said subject with successive initiation sequences for different slices.

10. A multislice magnetic resonance image scanner according to claim 9 wherein the means for applying the imaging sequences to a subject applies at least one initiation sequence, said initiation sequence comprising an inversion pulse, and applies at least one acquisition sequence, said acquisition sequence comprising a spin echo sequence, and a spatial encoding sequence comprising a slice selection gradient, a phase encoding gradient, and a readout gradient.

11. A multislice magnetic resonance image scanner according to claim 9 wherein the means for applying the imaging sequences to a subject applies at least one initiation sequence, said initiation sequence comprising an inversion pulse, and at least one acquisition sequence, said acquisition sequence comprising a gradient echo sequence, and a spatial encoding sequence comprising a slice selection gradient, a phase encoding gradient, and a readout gradient.

12. A multislice magnetic resonance image scanner according to claim 9 wherein the means for applying the imaging sequences to a subject applies at least one initiation sequence, said initiation sequence comprising an inversion pulse, and applies at least one acquisition sequence, said acquisition sequence comprising a saturation pulse, a spin echo sequence, and a spatial encoding sequence comprising a slice selection gradient, a phase encoding gradient, and a readout gradient.

13. A multislice magnetic resonance image scanner according to claim 9 wherein the means for applying the imaging sequences to a subject applies at least one initiation sequence, said initiation sequence comprising an inversion pulse, and at least one acquisition sequence, said sequence comprising a saturation pulse, a gradient echo sequence, and a spatial encoding sequence comprising a slice selection gradient, a phase encoding gradient, and a readout gradient.

14. A multislice magnetic resonance image scanner according to claim 10, 11, 12, or 13 wherein in the means for interleaving an acquisition sequence, the initiation sequence for each slice is followed by the acquisition sequence for the preceding slice.

15. A multislice magnetic resonance image scanner according to claim 10, 11, 12, or 13 wherein in the means for interleaving the acquisition sequence, the initiation sequence for slice Mod(i+L) is followed by the acquisition sequence for slice i where L = maximum integer value not greater than $$\frac{(T_i - T_p)}{(T_a + T_p)}$$

Mod (x) = x − (total number of slices), if x is greater than the total number of slices
= x, otherwise.

$T_i$ = time interval between initiation sequence and acquisition sequence for any given slice $T_p$ = width of the initiation sequence for any given slice $T_a$ = time length of the acquisition sequence and encoding for any given slice.

16. A multislice magnetic resonance image scanner according to claim 10, 11, 12, or 13 wherein the means for applying the imaging sequences applies multiple acquisition sequences.

* * * * *

UNITED STATES PATENT AND TRADEMARK OFFICE
CERTIFICATE OF CORRECTION

PATENT NO. : 5,406,203

DATED : April 11, 1995

INVENTOR(S) : Oh et al.

It is certified that error appears in the above-indentified patent and that said Letters Patent is hereby corrected as shown below:

Col. 1, line 22, "involves" should read --involve--

Col. 2, line 40, that portion of Equation (1) reading "$(1T_i+T_1)$" should read --$(T_i+T_a)$--

Col. 2, line 55, "are" should read --is--

Col. 2, line 62, "are" should read --is--

Col. 2, line 68, that portion of Equation (3) reading "$(T_{iI}+N*T_a)$" should read --$(T_i+N*T_a)$--

Col. 3, line 62, "$T_p 32\ 8$" should read --$T_p=8$--

Col. 5, line 13, "numbers" should read --number--

Col. 5, line 17, "numbers" should read --number--

Col. 7, line 2, "optimized" should read --be optimized--

Col. 7, line 5, "method[described" should read --method described--

UNITED STATES PATENT AND TRADEMARK OFFICE
CERTIFICATE OF CORRECTION

PATENT NO. : 5,406,203
DATED : April 11, 1995
INVENTOR(S) : Oh et al.

It is certified that error appears in the above-indentified patent and that said Letters Patent is hereby corrected as shown below:

Col. 7, line 15, "pulse" should read --and $\pi$ pulse--.

Signed and Sealed this

Eighteenth Day of July, 1995

Attest:

BRUCE LEHMAN

Attesting Officer

Commissioner of Patents and Trademarks